US009568789B2

United States Patent
Lin et al.

(10) Patent No.: US 9,568,789 B2
(45) Date of Patent: Feb. 14, 2017

(54) PANEL CARRIER FOR A LIQUID CRYSTAL ON SILICON PANEL AND METHOD FOR ELECTRICALLY INTERCONNECTING SAME

(71) Applicant: OmniVision Technologies, Inc., Santa Clara, CA (US)

(72) Inventors: Wei-Feng Lin, Hsinchu (TW); Chun-Sheng Fan, HsinChu (TW)

(73) Assignee: OmniVision Technologies, Inc., Santa Clara, CA (US)

(*) Notice: Subject to any disclaimer, the term of this patent is extended or adjusted under 35 U.S.C. 154(b) by 233 days.

(21) Appl. No.: 14/547,986

(22) Filed: Nov. 19, 2014

(65) Prior Publication Data

US 2016/0139446 A1 May 19, 2016

(51) Int. Cl.
  *G02F 1/1345* (2006.01)
  *G02F 1/1333* (2006.01)
  *H05K 3/32* (2006.01)

(52) U.S. Cl.
  CPC ..... *G02F 1/13458* (2013.01); *G02F 1/133308* (2013.01); *H05K 3/323* (2013.01); *H05K 2201/10136* (2013.01)

(58) Field of Classification Search
  CPC ... G02F 1/13458; G02F 1/133308; H05K 3/36
  See application file for complete search history.

(56) References Cited

U.S. PATENT DOCUMENTS 6,356,334 B1   3/2002   Mathew et al.
6,496,240 B1 * 12/2002   Zhang ............... G02F 1/133
                                                349/116
6,501,525 B2  12/2002   Huang et al.
6,897,933 B2   5/2005   Hoshina
7,786,747 B2   8/2010   Shih et al.
(Continued)

FOREIGN PATENT DOCUMENTS

WO        0177747 A2    10/2001

OTHER PUBLICATIONS

Steen, "Design of LCOS Microdisplay Backplanes for Projection Applications," ISBN 90-8578-062-4, Universiteit Gent, 2005-2006.
(Continued)

*Primary Examiner* — Anne Hines
*Assistant Examiner* — Jose M Diaz
(74) *Attorney, Agent, or Firm* — Lathrop & Gage LLP

(57) ABSTRACT

A liquid-crystal-on-silicon (LCOS) panel includes a wafer having bond pads thereon, a liquid crystal layer, and a conductive layer. The panel carrier for the LCOS panel includes a conductive-layer electrode for electrically connecting the conductive layer to a printed circuit assembly (PCA), address electrodes for electrically connecting the bond pads to the PCA, and a cavity for holding the LCOS panel. The cavity includes a conductive pad for electrically connecting the conductive layer to the conductive-layer electrode, and bond-pad electrodes for electrically connecting each bond pad to a respective address electrode. A method for electrically connecting an LCOS panel to a panel carrier includes a step of electrically connecting each bond pad to a respective address electrode, and a step of electrically connecting the conductive layer to the conductive pad.

18 Claims, 10 Drawing Sheets

(56) References Cited

U.S. PATENT DOCUMENTS

| | | | |
|---|---|---|---|
| 7,808,573 B2* | 10/2010 | Chen | G02F 1/136277 |
| | | | 349/150 |
| 8,339,563 B2 | 12/2012 | Huang | |
| 8,680,572 B2 | 3/2014 | O'Connor et al. | |
| 9,196,185 B2* | 11/2015 | Kim | G09G 3/006 |
| 9,324,344 B1* | 4/2016 | Chen | G11B 5/4853 |
| 2001/0054998 A1* | 12/2001 | Yeo | G02F 1/1345 |
| | | | 345/87 |
| 2002/0085158 A1 | 7/2002 | Armagost et al. | |
| 2006/0067064 A1* | 3/2006 | Crews | H05K 1/182 |
| | | | 361/761 |
| 2006/0082859 A1* | 4/2006 | Huibers | G02B 26/0833 |
| | | | 359/291 |
| 2010/0245703 A1* | 9/2010 | Lin | G02B 6/0083 |
| | | | 349/58 |
| 2010/0328590 A1 | 12/2010 | Huang | |
| 2012/0032205 A1* | 2/2012 | O'Connor | G02F 1/133308 |
| | | | 257/88 |
| 2012/0062571 A1* | 3/2012 | Malek | G06F 1/163 |
| | | | 345/501 |
| 2013/0293853 A1* | 11/2013 | Lin | G02B 26/0841 |
| | | | 353/98 |
| 2014/0339574 A1* | 11/2014 | Kang | H01L 27/124 |
| | | | 257/88 |
| 2015/0138483 A1* | 5/2015 | Lin | G02F 1/133308 |
| | | | 349/58 |
| 2015/0260994 A1* | 9/2015 | Akutsu | G02B 6/34 |
| | | | 359/567 |
| 2015/0260995 A1* | 9/2015 | Mukawa | G02B 27/0172 |
| | | | 345/8 |
| 2016/0067087 A1* | 3/2016 | Tedford | A61N 5/0613 |
| | | | 606/4 |
| 2016/0147098 A1* | 5/2016 | Isami | G02F 1/133308 |
| | | | 349/58 |
| 2016/0147105 A1* | 5/2016 | Ha | G02F 1/13452 |
| | | | 349/33 |

OTHER PUBLICATIONS

Underwood, "A Review of Microdisplay Technologies," the University of Edinburgh, A Keynote Paper presented at the Conference Entitled SID@EID, London, Nov. 21-23, 2000.

Goldstein, et al., "Packaging of Liquid Crystal on Silicon Microdisplays," website http://electroiq.com/blog/2001/05/packaging-of-liquid-crystal-on-silicon-microdisplays/, 2001.

Huang, et al., "Integrated Digital Input Driver for Active Matrix Liquid-Crystal-On-Silicon Display," Department of Electrical and Electronic Engineering, The Hong Kong University of Science of Technology, 1995.

Bleha, et al., "Advances in Liquid Crystal on Silicon (LCOS) Spatial Light Modulator Technology," Proc. of SPIE, vol. 8736, 2013.

Translation of Taiwanese Office Action corresponding to Taiwanese Patent Application No. 104137949, mailed Jun. 27, 2016, 4 pages.

* cited by examiner

PANEL CARRIER FOR A LIQUID CRYSTAL ON SILICON PANEL AND METHOD FOR ELECTRICALLY INTERCONNECTING SAME

BACKGROUND

This invention relates to the manufacture of liquid-crystal-on-silicon (LCOS) displays, and particularly, reducing the process flow for their manufacturing.

LCOS displays are used in consumer electronics, such as hand-held projectors and near-eye displays, and also have applications in optical communications technologies. LCOS displays include an LCOS panel that contains a pixel array formed on a semiconductor wafer. A packaged LCOS panel includes a means to individually address each pixel within the pixel array. Pixel addressing requires electrically connecting bond pads on the wafer to a signal source—typically through a flexible printed circuit array (FPCA). Conventional LCOS packaging employs wire bonding to connect the bonds pads to the FPCA. Wire bonding's fragility and labor-intensive connection process makes wire bonding a significant cost driver.

SUMMARY OF THE INVENTION

According to an embodiment, a panel carrier for an LCOS panel is provided. A liquid-crystal-on-silicon (LCOS) panel includes a wafer having bond pads thereon, a liquid crystal layer, and a conductive layer. The panel carrier for the LCOS panel includes a conductive-layer electrode for electrically connecting the conductive layer to a printed circuit assembly (PCA), address electrodes for electrically connecting the bond pads to the PCA, and a cavity for holding the LCOS panel. The cavity includes a conductive pad for electrically connecting the conductive layer to the conductive-layer electrode, and bond-pad electrodes for electrically connecting each bond pad to a respective address electrode.

According to another embodiment, a method for electrically connecting an LCOS panel to a panel carrier is disclosed. The panel carrier has a conductive pad and a conductive-layer electrode electrically connected thereto, a plurality of bond-pad electrodes and a respective plurality of address electrodes electrically connected thereto. The LCOS panel has a conductive layer and a semiconductor wafer with a plurality of bond pads thereon. The method includes a step of electrically connecting each bond pad to a respective address electrode, and a step of electrically connecting the conductive layer to the conductive pad.

DETAILED DESCRIPTION

Figure 1:
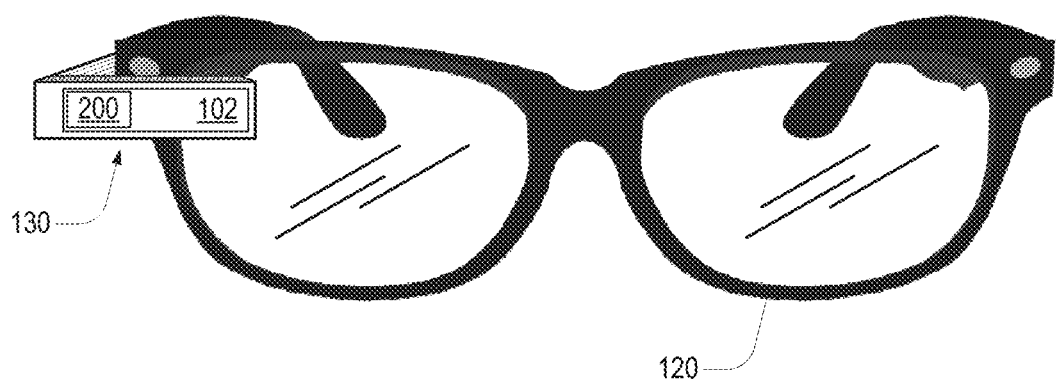
FIG. 1 shows a prior art LCOS panel on a printed circuit board (PCB) incorporated into a near-eye display attached to a pair of eyeglasses.

FIG. 1 shows one exemplary use scenario for a prior art LCOS panel 200, wherein LCOS panel 200 is located on a PCB 102 incorporated into a near-eye display 130 attached to eyeglasses 120. LCOS panel 200 may alternately be employed in a different display device, such as in a hand-held image projector.

Figure 2:
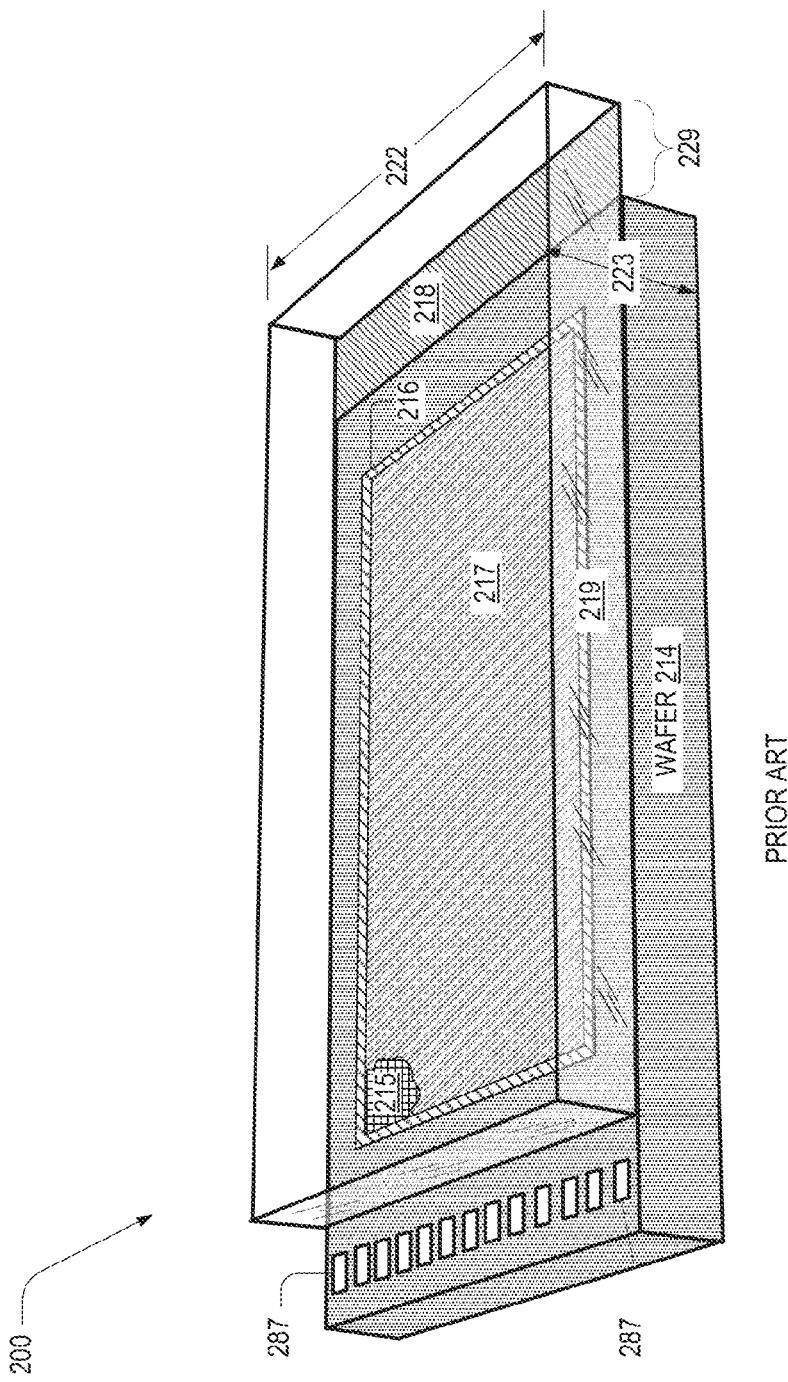
FIG. 2 is a perspective view of the prior-art LCOS panel of FIG. 1.

FIG. 2 is a perspective view of prior-art LCOS panel 200. LCOS panel 200 includes a cover glass 219 on a semiconductor wafer 214. A liquid crystal layer 217 is between cover glass 219 and semiconductor wafer 214. A pixel array 215 is between the liquid crystal layer 217 and semiconductor wafer 214. A corner portion of liquid crystal layer 217 is not shown to reveal pixel array 215 beneath it. Semiconductor wafer 214 includes a plurality of bond pads 287 that control each pixel of pixel array 215, as known in the art.

A transparent conductive layer 218 is on the surface of cover glass 219 adjacent to liquid crystal layer 217. For clarity of illustration, FIG. 2 shows only a portion of conductive layer 218 on overhang region 229 of cover glass 219. Dam 216 contains liquid crystal layer 217. Semiconductor wafer 214 is formed of silicon, for example. Transparent conductive layer 218 is deposited on cover glass 219, and is, for example, formed of indium titanium oxide (ITO). LCOS panel 200 has a panel width 222 and a panel depth 223.

Figure 3:
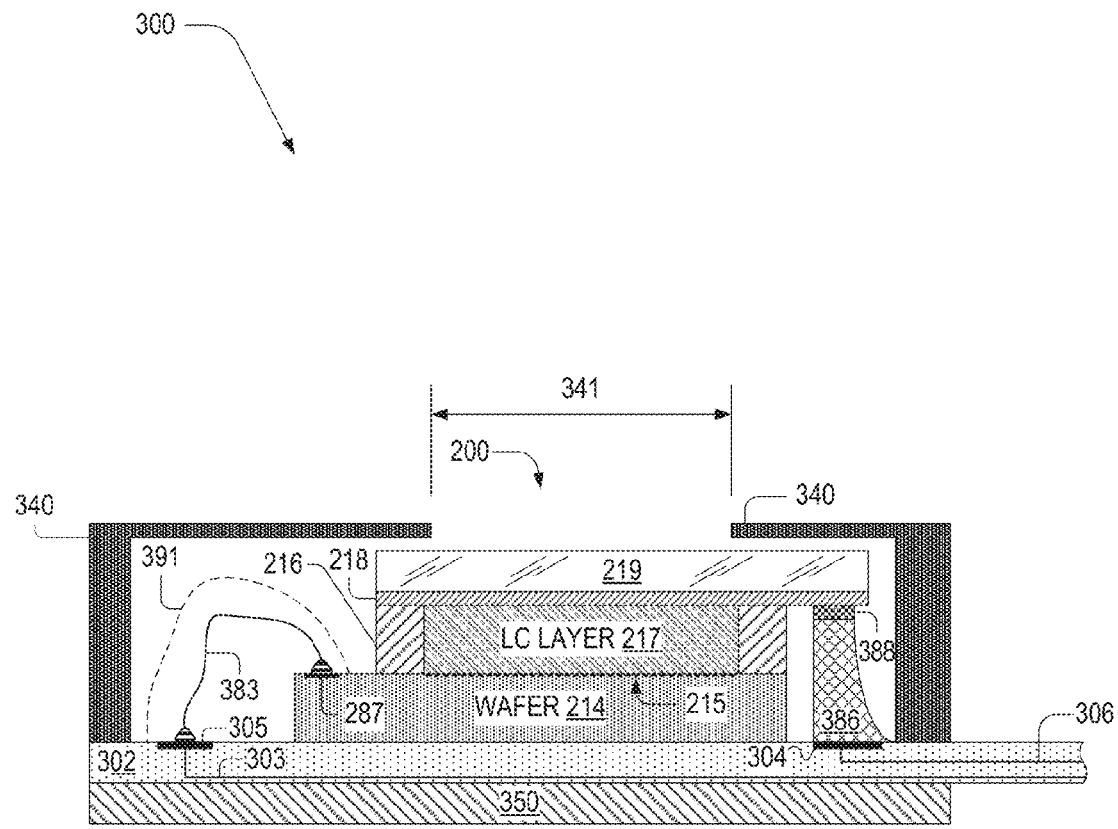
FIG. 3 is a cross-sectional view of a prior-art LCOS panel module that includes an LCOS panel electrically connected to a flexible printed circuit assembly (FPCA).

FIG. 3 is a cross-sectional view of a prior-art LCOS panel module 300 that includes LCOS panel 200 electrically connected to a flexible printed circuit assembly (FPCA) 302. In FIG. 3, reference numerals between 200 and 300 denote parts of LCOS panel 200 introduced in FIG. 2. LCOS panel module 300 resembles LCOS panel modules of U.S. Pat. No. 8,808,573. FPCA 302 includes a surface-mount connector (not shown) for mechanical and electrical connection to a printed circuit board. The portion of FPCA 302 shown in FIG. 2 is bonded to a rigid substrate 350 which is formed of metal, for example.

LCOS panel 200 is electrically connected to FPCA 302 via a plurality of wire bonds 383, conductive glue 386, and a soldering layer 388. Soldering layer 388 and conductive glue 386 electrically connect transparent conductive layer 218 to a conductive pad 304 of FPCA 302, which is connected to a conductive pad trace 306 of FPCA 302. Each of a plurality of address electrodes 305 of FPCA 302 receives a signal from a respective one of a plurality of address electrode traces 303 of FPCA 302. Each wire bond 383 carries a signal from a respective address electrode 305 to a respective bond pad 287. Address electrodes 305, wire bonds 383, and bond pads 287 are arranged in respective one-dimensional arrays into the plane of FIG. 3 such that each address electrode 305 is substantially aligned with a respective bond pad 287.

Encapsulation glue 391 covers wire bonds 383. An opaque face mask 340 covers a portion of cover glass 219 to define an aperture 341 and prevent stray light from entering liquid crystal layer 217.

Figure 4:
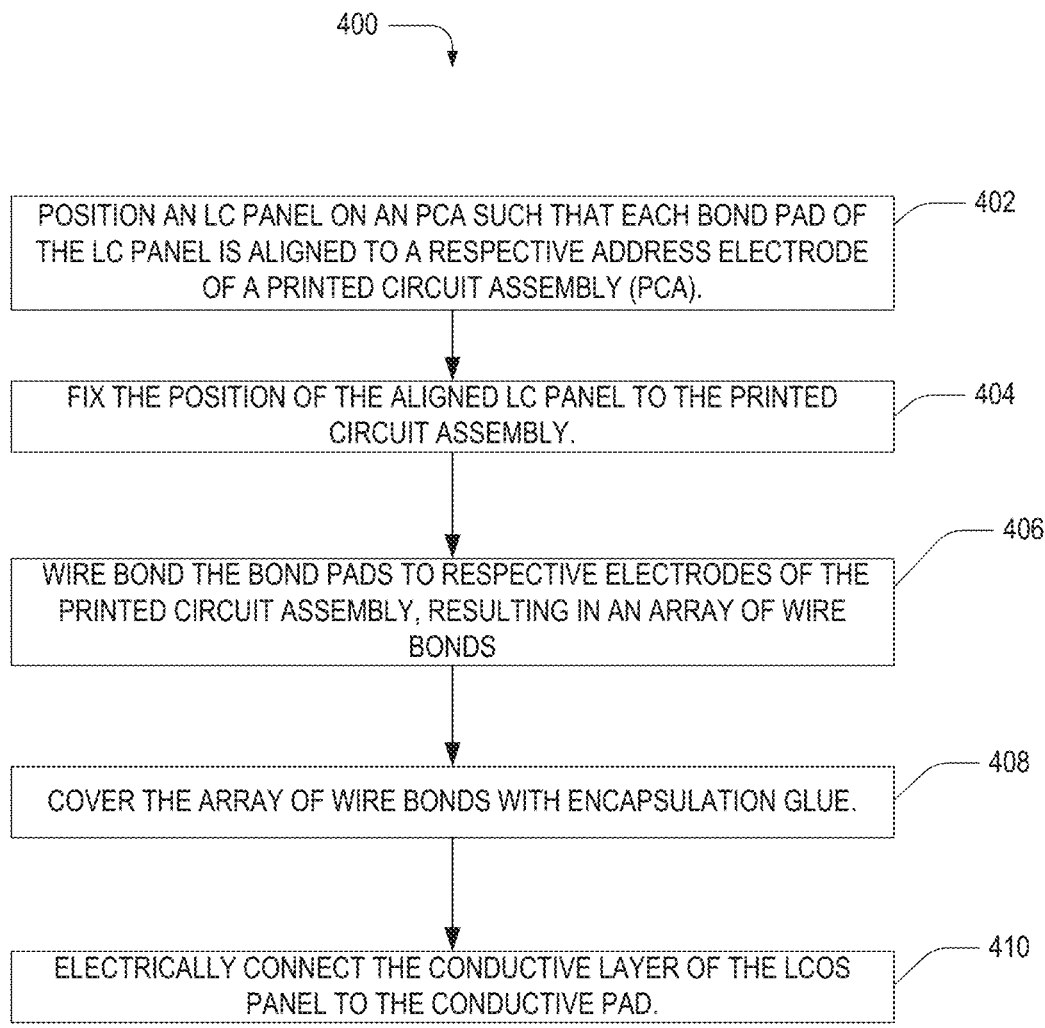
FIG. 4 is a flowchart illustrating a method for electrically connecting an LCOS panel to a printed circuit assembly (PCA).

FIG. 4 is a flowchart illustrating a prior-art method 400 for electrically connecting a liquid crystal on silicon (LCOS) panel to a printed circuit assembly (PCA). The LCOS panel of the LCOS panel module includes a semiconductor wafer with an array of bond pads on its surface. The LCOS panel also includes a soldering layer on a transparent conductive layer. In one example, method 400 electrically connects LCOS panel 200 to the PCA.

In step 402, method 400 positions the LCOS panel on the PCA such that each bond pad of the LCOS panel is aligned to a respective address electrode of the PCA. In an example of step 402, method 400 positions LCOS panel 200 on FPCA 302 such that each bond pad 287 of LCOS panel 200 is aligned to a respective address electrode 305.

In step 404, method 400 fixes the position of the aligned LCOS panel to the printed circuit assembly. In an example of step 404, method 400 die bonds LCOS panel 200 to FPCA 302. In step 406, method 400 wire bonds each bond pad to a respective electrode of the printed circuit assembly. In an example of step 406, method 400 wire bonds each bond pad 287 to a respective address electrode 305 with wire bond 383, resulting in a wire bond array.

In step 408, method 400 covers each wire bond with encapsulation glue. In an example of step 408, method 400 covers wire bonds 383 with encapsulation glue 391.

In step 410, method 400 electrically connects the soldering layer to a common electrode on the printed circuit assembly. In an example of step 410, method 400 electrically connects soldering layer 388 and conductive pad 304 of FPCA 302 with conductive glue 386.

Of the five steps of method 400, four require the completion of another step. Step 404 must follow step 402. Since the wire bonds of step 406 are fragile, and may break if the position of the LCOS panel on the PCA is not fixed, step 406 requires the completion of step 404. Step 408 requires the completion of step 406. Step 410 requires the completion of at least step 402, and with possible exceptions, also step 404.

Disclosed herein is a panel carrier for an LCOS panel, which eliminates the need for wire-bond connections, such as wire bonds 383, between the LCOS panel and a PCA. The panel carrier enables manufacture of sturdy LCOS devices. The panel carrier provides a wire-bond-free interface between an LCOS panel, such as those used in commercial LCOS devices, and its associated printed circuit assembly. The panel carrier may thus improve the robustness and reliability of such LCOS devices.

Figure 5:
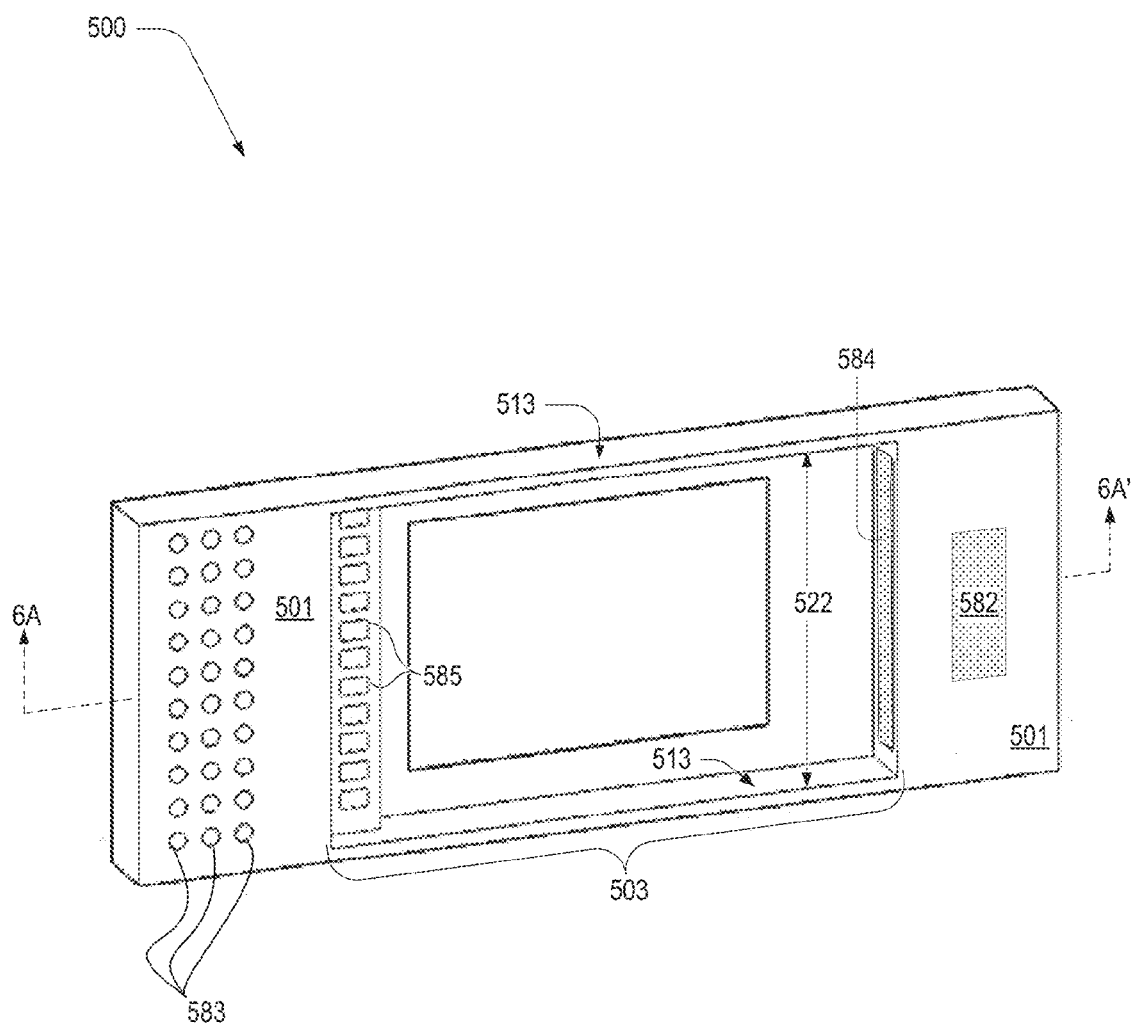
FIG. 5 is a perspective view of a first panel carrier for an LCOS panel, in an embodiment.

FIG. 5 is a perspective view of an exemplary panel carrier 500 for an LCOS panel, for example, LCOS panel 200 of FIG. 2. Panel carrier 500 may be formed of a ceramic material such as aluminum oxide ($Al_2O_3$) or aluminum nitride (AlN). As F. Bechtold discusses in "A comprehensive overview on today's ceramic substrate technologies" (IEEE Microelectronics and Packaging Conference, 2009, pp. 1-12), ceramic materials have physical properties, such as thermal conductivity, thermal expansion coefficient and flexural strength, that makes them appropriate for microelectronics packaging applications such as the panel carrier discussed herein.

Panel carrier 500 has a mounting surface 501 that includes an exposed surface of a conductive-layer electrode 582 and an exposed plurality of address electrodes 583. Electrodes 582 and 583 may be configured to interface with a standard flexible printed circuit (FPC) connector, a wire-to-board connector, a board-to-board connector, a backplane connector, a surface mount connector, and the like. For clarity of illustration, not all electrodes 583 are labelled in FIG. 5.

Panel carrier 500 includes a cavity 503 that includes a conductive pad 584 and a plurality of bond-pad electrodes 585. For clarity of illustration, not all bond-pad electrodes 585 are labelled in FIG. 5. Conductive pad 584 is formed of gold, for example. In the embodiment of FIG. 5, conductive pad 584 is in a geometric plane perpendicular to mounting surface 501. In the embodiment of FIG. 5, bond-pad electrodes are in a geometric plane parallel to mounting surface 501. Cavity walls 513 may include a notch that exposes a side of an LCOS panel disposed in the cavity, without departing from the scope hereof.

Conductive-layer electrode 582 is electrically connected to conductive pad 584 through connections not visible in the view of FIG. 5. Each bond-pad electrode 585 is electrically connected to an address electrode 583 through connections not visible in the view of FIG. 5.

In an embodiment of panel carrier 500, the electrical connections between address electrodes 583 and bond-pad electrodes 585 result from each address electrode 583 and a corresponding bond-pad electrode 585 being two surfaces of a single continuous conductive element. Similarly, each conductive pad 584 and corresponding conductive-layer electrode 582 may be formed of a single conductive element.

Figure 6:
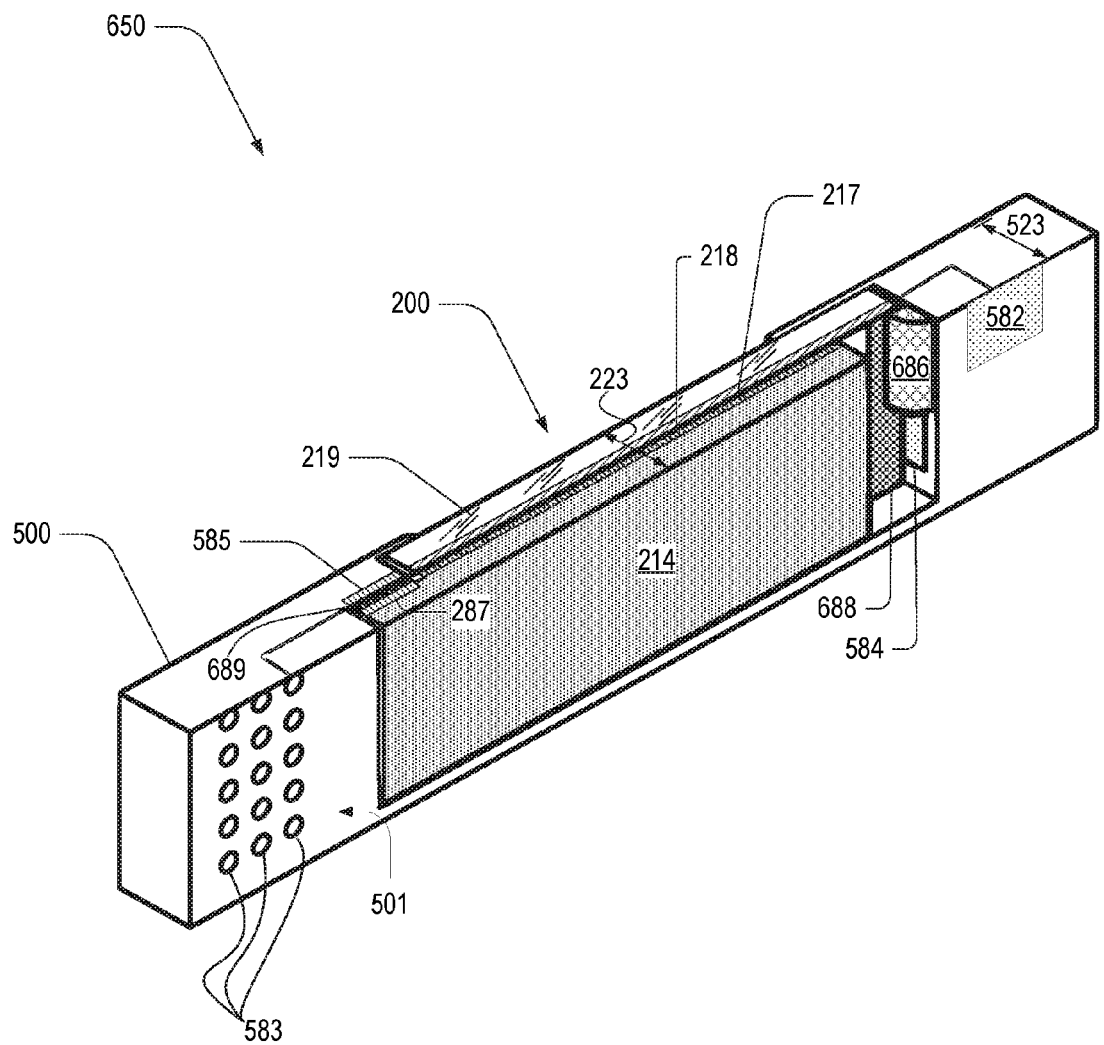
FIG. 6 is a cross-sectional perspective view of an LCOS device formed by an LCOS panel within the panel carrier of FIG. 5, in an embodiment.
Figure 7:
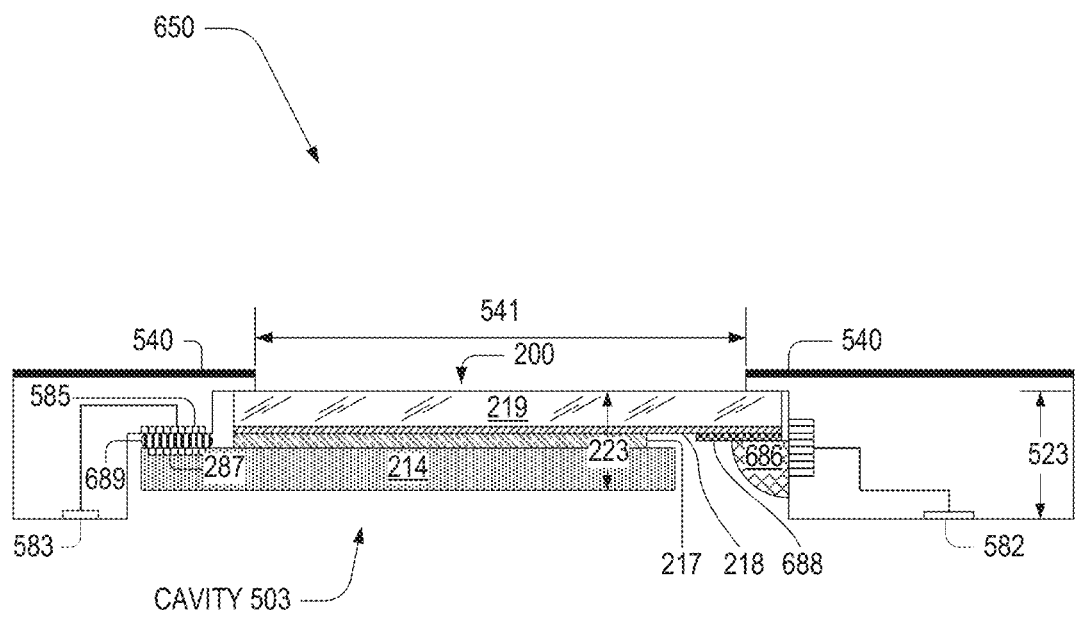
FIG. 7 is a second cross-sectional view of the LCOS device of FIG. 6, in an embodiment.

FIG. 6 is a cross-sectional perspective view of an exemplary LCOS device 650 formed by LCOS panel 200 within panel carrier 500. The cross-sectional view of FIG. 6 is along cross-section 6A-6A' and in a plane orthogonal to mounting surface 501, FIG. 5. FIG. 7 is a second cross-sectional view of LCOS device 650 that shows LCOS device 650 in more detail than in FIG. 6, wherein the cross section is taken in a plane orthogonal to mounting surface 501. FIG. 6 and FIG. 7 are best viewed together in the following description.

Without departing from the scope hereof, a depth 523 of cavity 503 may exceed or be the same as a panel depth 223 of LCOS panel 200 such that LCOS panel 200 does not extend beyond mounting surface 501 of panel carrier 500, or depth 523 may be less than panel depth 223 such that LCOS panel 200 protrudes out from mounting surface 501.

An opaque face mask 540 covers a portion of cover glass 219 to define an aperture 541 and prevent stray light from entering liquid crystal layer 217. An anisotropic conductive layer 689 electrically connects address electrodes 583 to bond pads 287. Compared to wire bonds 383 (FIG. 3), anisotropic conductive layer 689 is more robust and easier to apply. Bond pads 287 may be formed of aluminum, or other bond pad conductor materials suitable for use on the material, e.g., silicon, of semiconductor wafer 214.

In an embodiment of LCOS device 650, each bond pad 287 on semiconductor wafer 214 is aligned to and electrically connected to a respective bond-pad electrode 585 (FIG. 5) with anisotropic conductive layer 689. Anisotropic conductive layer 689 may be formed of a single, continuous portion of a commercially available anisotropic conductive glue, anisotropic paste, or anisotropic conductive film. Alternatively, anisotropic conductive layer 689 may include separate portions of conductive glue each deposited on a respective bond-pad electrode 585, the volume of each portion being small enough such that the portions remain separate upon curing.

The alignment of each bond pad 287 to a respective bond-pad electrode 585 is necessary because, when applied as known in the art, anisotropic conductive layer 689 is conductive only in the direction normal to the plane of the film. When LCOS panel 200 is positioned in cavity 503 of panel carrier 500, each bond pad 287 is aligned over at most one bond-pad electrode 585 to ensure that each bond pad 287 receives signals from at most one bond-pad electrode 585. Cavity 503 is sized such that LCOS panel 200 fits snugly therein to maintain the one-to-one alignment of bond pads 287 with bond-pad electrodes 585. For example, cavity 503 has a width 522 that exceeds panel width 222 of LCOS panel 200 by no more than a minimum spacing 597 (FIG. 9) between centers of adjacent bond pads 287.

Conductive glue 686 electrically connects conductive pad 584 to an optional soldering layer 688, which is deposited on transparent conductive layer 218. In an embodiment of LCOS device 650 that does not include soldering layer 688, conductive glue 686 electrically connects conductive pad 584 directly to transparent conductive layer 218.

Figure 8:
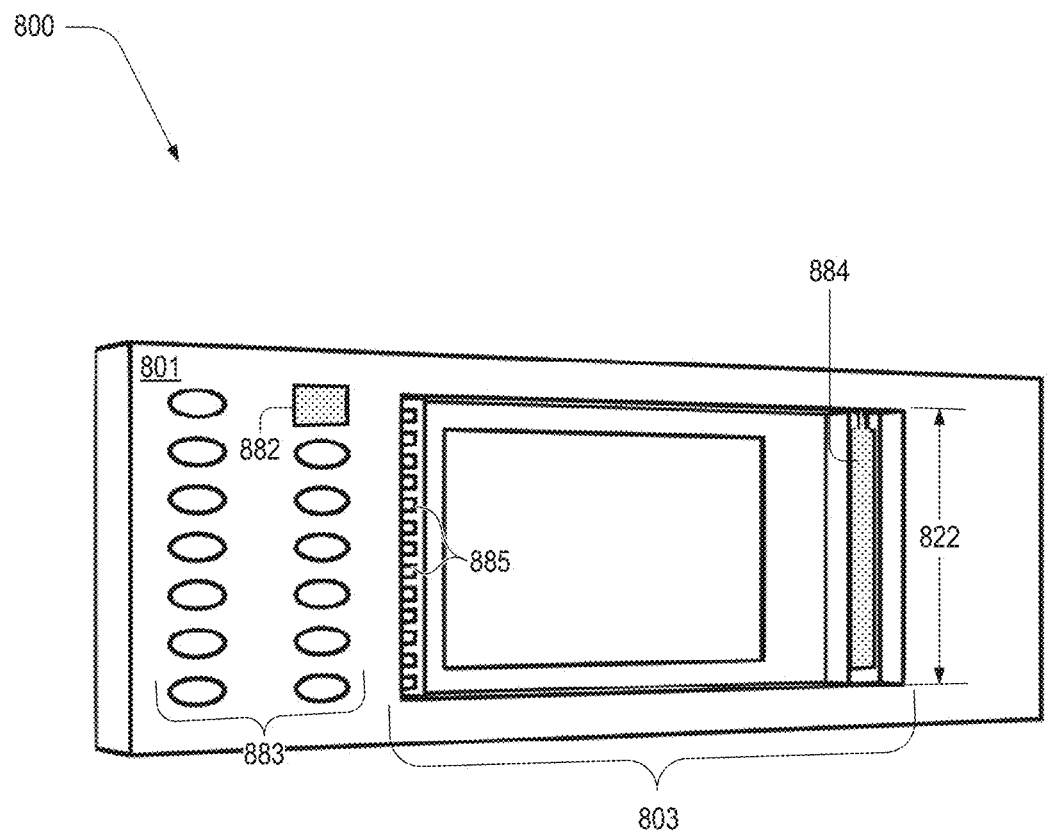
FIG. 8 is a perspective view of a second panel carrier for an LCOS panel, in an embodiment.

FIG. 8 is a perspective view of an exemplary panel carrier 800 for an LCOS panel, for example, LCOS panel 200 of FIG. 2. Like panel carrier 500, panel carrier 800 may be formed of a ceramic material such as aluminum oxide ($Al_2O_3$) or aluminum nitride (AlN), and have either a filled or hollow interior. Panel carrier 800 includes a plurality of address electrodes 883 that are electrically connected to a respective plurality of bond-pad electrodes 885. Panel carrier 800 also includes a conductive layer electrode 882 that is electrically connected to a conductive pad 884. Electrodes 882, 883, and 885 are functionally similar to electrodes 582, 583, and 585, respectively. Conductive pad 884 is similar to conductive pad 584.

Panel carrier includes a cavity 803 in a mounting surface 801. Cavity 803 and mounting surface 801 are functionally similar to cavity 503 and mounting surface 501, respectively, of panel carrier 500. Cavity 803 is sized such that LCOS panel 200 fits snugly therein to maintain the one-to-one alignment of bond pads 287 with bond-pad electrodes 885. For example, cavity 803 has a width 822 that exceeds panel width 222 of LCOS panel 200 by no more than a minimum spacing 597 (FIG. 9) between centers of adjacent bond pads 287.

A difference between panel carrier 500 and panel carrier 800 is the location of their respective conductive layer electrodes. Whereas conductive-layer electrode 582 is adjacent to cavity 503 on the side of cavity 503 that includes conductive pad 584, conductive layer electrode 882 is adjacent to cavity 803 on the side of cavity 803 that includes bond-pad electrodes 885.

A second difference between panel carrier 500 and panel carrier 800 is the relationship between the respective planes of the conductive pad and the bond-pad electrodes. In panel carrier 500, conductive pad 584 and bond-pad electrodes 585 are in non-parallel planes. In the embodiment of FIG. 5, conductive pad 584 and bond-pad electrodes 585 are in orthogonal planes. In panel carrier 800, conductive pad 884 and bond-pad electrodes 885 are in parallel planes.

The two differences between panel carriers 500 and 800, discussed above, are independent of each other. For example, in panel carrier 800, conductive pad 884 and bond-pad electrodes 885 may be in non-parallel planes, as conductive pad 584 and bond-pad electrodes 585 are in panel carrier 500.

Figure 9:
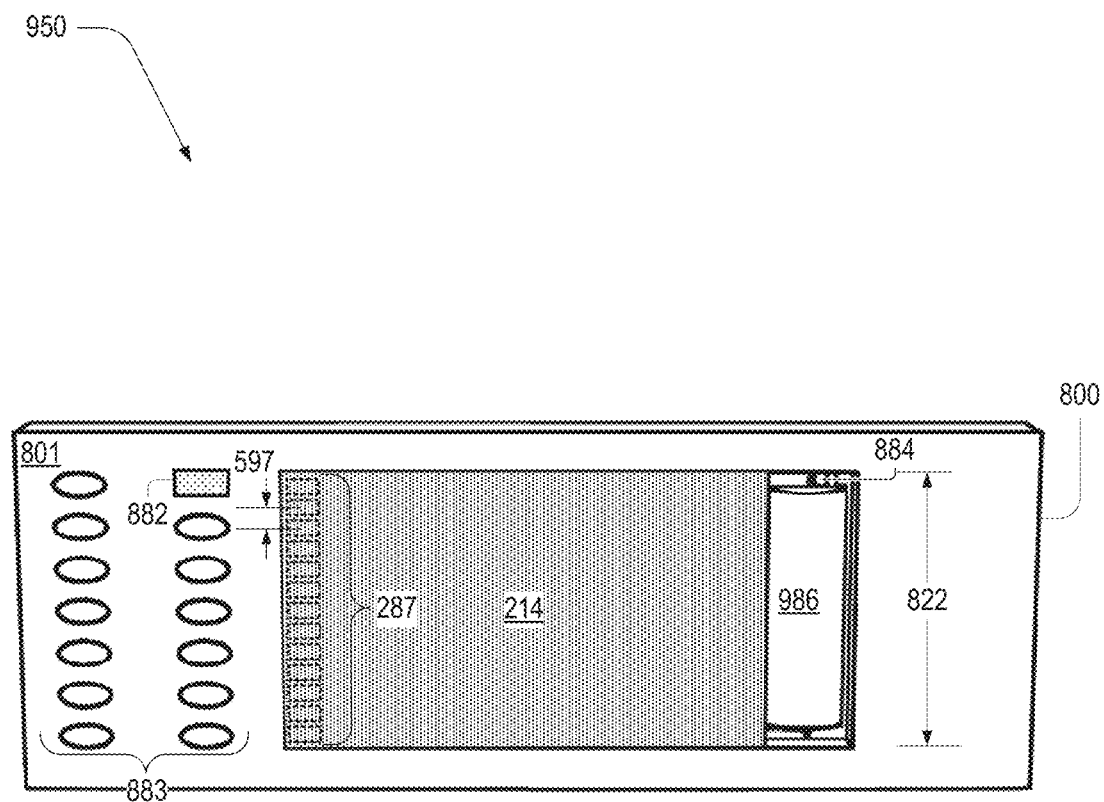
FIG. 9 is a perspective view of an LCOS device formed by the LCOS panel of FIG. 2 within the panel carrier of FIG. 8, in an embodiment.

FIG. 9 is a perspective view of an LCOS device 950 formed by LCOS panel 200 within panel carrier 800. Due to the orientation of LCOS device 950 in FIG. 9, semiconductor wafer 214 is the only visible part of LCOS panel 200.

Conductive glue 986 electrically connects conductive pad 884 to an optional soldering layer, not shown, which is similar to soldering layer 688 and is deposited on transparent conductive layer 218, shown in FIG. 6. In an embodiment of LCOS device 950, which does not include this soldering layer, conductive glue 986 electrically connects conductive pad 884 directly to transparent conductive layer 218. Each bond pad 287 of LCOS panel 200 is electrically connected to a respective bond-pad electrode 885, for example, by an anisotropic conductive element similar to anisotropic conductive layer 689.

Figure 10:
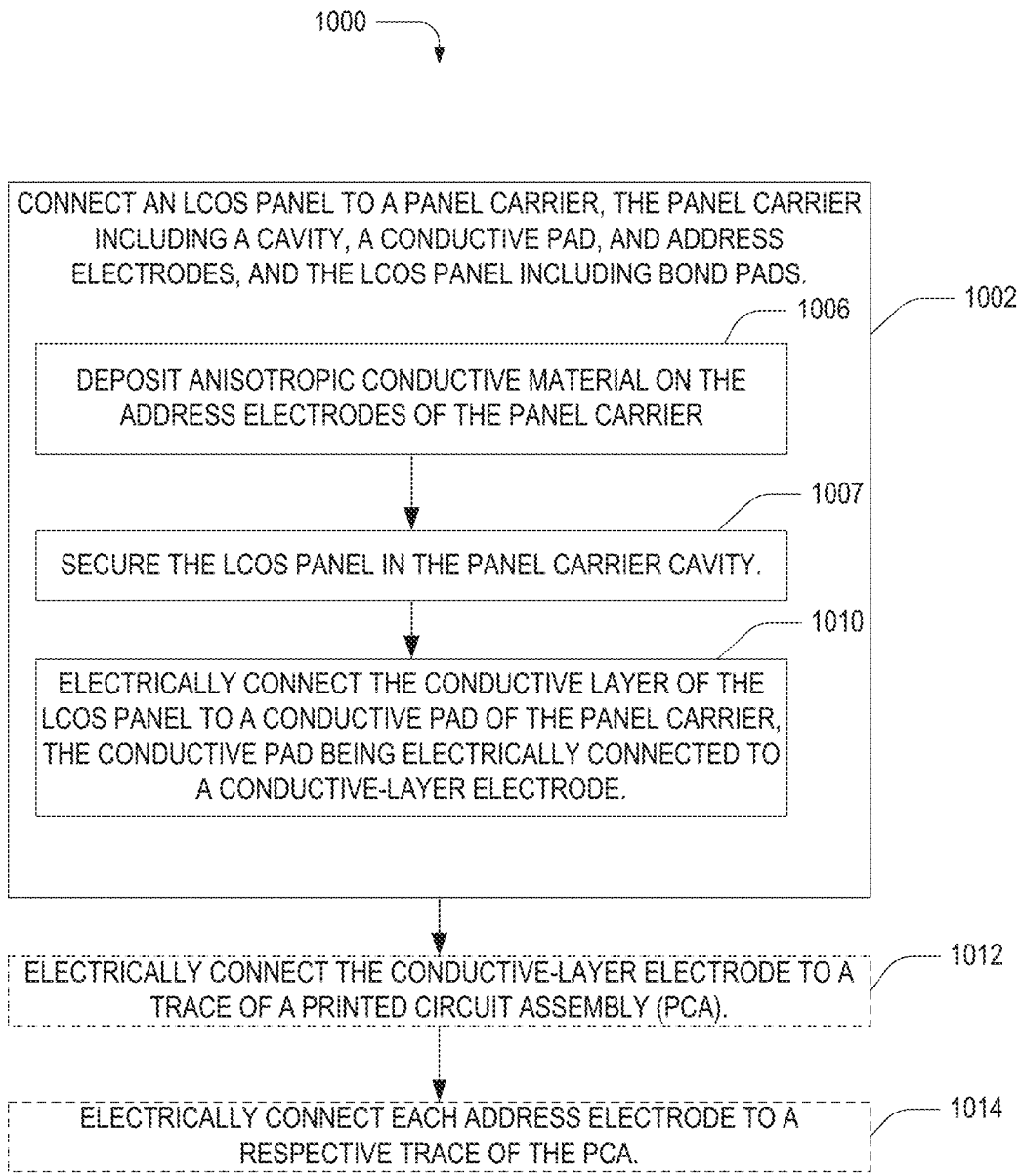
FIG. 10 is a flowchart illustrating a method for electrically connecting an LCOS panel to a PCA via a panel carrier, in an embodiment.

FIG. 10 is a flowchart illustrating an exemplary method 1000 for electrically connecting an LCOS panel to a PCA via a panel carrier. In step 1002, method 1000 connects an LCOS panel to a panel carrier. The panel carrier may include one or more of the following elements: a cavity, a conductive pad and a conductive layer electrode electrically connected thereto, and a plurality of bond-pad electrodes and a respective plurality of address electrodes electrically connected thereto. In the following, method 1000 is discussed in the context of connecting LCOS panel 200 to panel carrier 800. However, method 1000 applies to other panel carriers having the above-mentioned elements and LCOS panels having a plurality of bond pads and a conductive layer, such as panel carrier 500, without departing from the scope hereof.

The LCOS panel of step 1002 includes a conductive layer and a semiconductor wafer with bond pads thereon. Step 1002 includes steps 1006, 1007, and 1010. In step 1006, method 1000 deposits anisotropic conductive material on one or both of the panel carrier bond-pad electrodes and the LCOS panel bond pads. In an example of step 1006, anisotropic conductive layer 689 is deposited on one or both of the bond-pad electrodes 885 and wafer bond pads 287.

In step 1007, method 1000 secures the LCOS panel in the panel carrier cavity, resulting in electrical connections between each wafer bond pad and a respective address electrode via a bond-pad electrode. In an example of step 1007, LCOS panel 200 is secured in cavity 803 of panel carrier 800, via die bonding for example, resulting in an electrical connections between each wafer bond pad 287 and a respective address electrode 883 via a respective bond-pad electrode 885.

By holding an LCOS panel such that each wafer bond pad (287) of the LCOS panel is properly aligned with a respective bond-pad electrode (585), an LCOS panel carrier (e.g., LCOS panel carriers 500 and 800) makes the steps 402 (positioning) and 404 (fixing the position) of prior-art method 400 unnecessary in method 1000.

In step 1010, method 1000 electrically connects the conductive layer to the conductive pad. In an example of step 1010, transparent conductive layer 218 of LCOS panel 200 is electrically connected to conductive pad 884 of panel carrier 800 with conductive glue 686 (FIG. 6).

Steps 1012 and 1014 are optional. If included, in step 1012, method 1000 electrically connects the conductive-layer electrode to a trace of the PCA. In an example of step 1012, conductive-layer electrode 882 of panel carrier 800 is electrically connected to conductive pad 304 of FPCA 302.

If included, in step 1014, method 1000 electrically connects each address electrode to a respective trace of the PCA. In an example of step 1014, each address electrode 583 of panel carrier 500 is electrically connected to a respective address electrode 305 of FPCA 302.

Whereas three of the five steps of method 400 require the completion of a different step of the method, method 1000 has fewer restrictions on step order. Method 1000 places no restrictions on the order of steps 1002, 1012, and 1014. In method 1000, bond pads of the LCOS panel can be aligned to respective bond pad electrodes of the LCOS carrier before the LCOS panel is positioned anywhere on a PCA. For example, bonds pads 285 of LCOS panel 200 can be aligned to respective bond pad electrodes 885 of LCOS carrier 800 before the LCOS panel 200 is positioned anywhere on FPCA 302.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A panel carrier for a liquid crystal on silicon (LCOS) panel, having a semiconductor wafer with a plurality of bond pads thereon, a liquid crystal layer, and a conductive layer, comprising:
   a conductive-layer electrode for electrically connecting the conductive layer to a printed circuit assembly;
   a plurality of address electrodes for electrically connecting the bond pads to the printed circuit assembly;
   a cavity for holding the LCOS panel, and including:
      a conductive pad for electrically connecting the conductive layer to the conductive-layer electrode; and
      a plurality of bond-pad electrodes for electrically connecting a respective one of the plurality of bond pads to a respective one of the plurality of address electrodes.

2. The panel carrier of claim 1, further comprising an anisotropic conductive layer for electrically connecting a respective one of the plurality of bond pads to a respective one of the plurality of bond-pad electrodes.

3. The panel carrier of claim 1, the cavity and the LCOS panel having relative dimensions that ensure proper alignment between each of the plurality of bond-pad electrodes and a corresponding one of the plurality of bond pads.

4. The panel carrier of claim 1, the plurality of bond pads being arrayed on the semiconductor wafer, the cavity having a width exceeding a width of the LCOS panel by no more than a minimum spacing between adjacent bond pads.

5. The panel carrier of claim 1, the panel carrier further comprising a planar mounting surface, and the cavity having a depth equaling or exceeding a height of the LCOS panel, the depth and the height being perpendicular to the planar mounting surface.

6. The panel carrier of claim 1, wherein one or both of:
   (a) the conductive pad and the conductive-layer electrode being parts of a first single continuous conductive element, and
   (b) each of the plurality of bond-pad electrodes and the respective address electrode being part of a second single continuous conductive element.

7. A method for electrically connecting a liquid crystal on silicon (LCOS) panel to a panel carrier having a conductive pad and a conductive-layer electrode electrically connected thereto, a plurality of bond-pad electrodes and a respective plurality of address electrodes electrically connected thereto, the LCOS panel including a conductive layer and a semiconductor wafer with a plurality of bond pads thereon, the method comprising:
   electrically connecting each bond pad to a respective address electrode;
   electrically connecting the conductive layer to the conductive pad;
   electrically connecting, via the panel carrier, the conductive-layer electrode to a conductive-layer electrode trace of a printed circuit assembly; and
   electrically connecting, via the panel carrier, each address electrode to a respective address electrode trace of the printed circuit assembly.

8. The method of claim 7, the panel carrier further comprising a cavity, the step of electrically connecting each bond pad comprising:
   depositing a portion of anisotropic conductive material on one or both of the plurality bond-pad electrodes and the bond pads; and
   securing the LCOS panel in the cavity such that the portion of anisotropic conductive material is between the plurality of bond-pad electrodes and the bond pads.

9. The method of claim 8, step of securing comprising die bonding the LCOS panel in the cavity.

10. The method of claim 8, the step of securing the LCOS panel preceding either or both of (a) the step of electrically connecting the conductive-layer electrode and (b) the step of electrically connecting each address electrode.

11. The method of claim 8, the step of securing the LCOS panel following either or both of (a) the step of electrically connecting the conductive-layer electrode and (b) the step of electrically connecting each address electrode.

12. A liquid crystal on silicon (LCOS) device comprising:
   a panel carrier including
      (i) a conductive-layer electrode for electrically connecting the conductive layer to a printed circuit assembly,
      (ii) a plurality of address electrodes for electrically connecting the bond pads to the printed circuit assembly, and
      (iii) a cavity having a conductive pad for electrically connecting the conductive layer to the conductive-layer electrode, and a plurality of bond-pad electrodes for electrically connecting a respective one of the plurality of bond pads to a respective one of the plurality of address electrodes;
   an LCOS panel in the cavity and comprising a conductive layer and a semiconductor wafer with a plurality of bond pads thereon,
   the panel carrier being electrically connected to the conductive layer and the plurality of bond pads.

13. The LCOS device of claim 12, further comprising the printed circuit assembly, the printed circuit assembly being electrically connected to the panel carrier.

14. The LCOS device of claim 12, further comprising an anisotropic conductive layer electrically connecting each of the plurality of bond pads to a respective one of the plurality of address electrodes.

15. The LCOS device of claim 12, the cavity and the LCOS panel having relative dimensions that ensure proper alignment between each of the plurality of bond-pad electrodes and a corresponding one of the plurality of bond pads.

16. The LCOS device of claim 12, the plurality of bond pads being arrayed on the semiconductor wafer, the cavity having a width exceeding a width of the LCOS panel by no more than a minimum spacing between adjacent bond pads.

17. The LCOS device of claim 12, the panel carrier further comprising a planar mounting surface, and the cavity having a depth equaling or exceeding a height of the LCOS panel, the depth and the height being perpendicular to the planar mounting surface.

18. The LCOS device of claim 12, one or both of (a) the conductive pad and the conductive-layer electrode being parts of a first single continuous conductive element and (b)

each of the plurality of bond-pad electrodes and its respective address electrode being part of a second single continuous conductive element.

\* \* \* \* \*